US012696399B2

(12) United States Patent　　　　　(10) Patent No.: US 12,696,399 B2
Lewis et al.　　　　　　　　　　　　　(45) Date of Patent: Jul. 28, 2026

(54) REWORKING SOLDER COMPONENT WITHOUT PART REMOVAL

(71) Applicant: INTERNATIONAL BUSINESS MACHINES CORPORATION, Armonk, NY (US)

(72) Inventors: Theron Lee Lewis, Rochester, MN (US); Timothy P. Younger, Rochester, MN (US); David J. Braun, St. Charles, MN (US); John R. Dangler, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 746 days.

(21) Appl. No.: 17/969,187

(22) Filed: Oct. 19, 2022

(65) Prior Publication Data

US 2024/0138074 A1　　Apr. 25, 2024
US 2024/0237228 A9　　Jul. 11, 2024

(51) Int. Cl.
　　*H05K 3/3447*　　(2026.01)
　　*H05K 3/3452*　　(2026.01)
　　*H05K 3/3485*　　(2026.01)
　　*H05K 3/3494*　　(2026.01)
　　*H05K 1/184*　　(2026.01)

(52) U.S. Cl.
　　CPC ......... *H05K 3/3494* (2013.01); *H05K 3/3447* (2013.01); *H05K 3/3452* (2013.01); *H05K 3/3485* (2020.08); *H05K 1/184* (2013.01)

(58) Field of Classification Search
　　CPC .. H05K 3/3494; H05K 3/3447; H05K 3/3452;

H05K 3/3485; H05K 2203/046; H05K 2203/085; H05K 2203/1476; H05K 3/225; H05K 1/184; Y10T 29/4913; Y10T 29/49139; Y10T 29/49144
See application file for complete search history.

(56) References Cited

U.S. PATENT DOCUMENTS 4,051,550 A * 9/1977 Seno ...................... H05K 1/167
　　　　　　　　　　　　　　　　　　　　　361/779
5,000,691 A * 3/1991 Olsson ................. H05K 3/3447
　　　　　　　　　　　　　　　　　　　　　439/876

(Continued)

FOREIGN PATENT DOCUMENTS

CN　　102291945 B　　12/2011
CN　　102111991 B　　9/2012

(Continued)

OTHER PUBLICATIONS

Coleman et al., "Intrusive Reflow of Lead-free Solder Paste", SMT-TULSA. Nov. 2007, pp. 1-6.

(Continued)

*Primary Examiner* — Donghai D Nguyen
(74) *Attorney, Agent, or Firm* — CHIP LAW GROUP

(57) ABSTRACT

A method for forming an electronic device that includes solder bonding pins from a component to plated through holes of a board, the component being positioned on a first side of the board; and applying solder paste to openings of the plated through holes on a second side of the board opposite the first side of the board that the component is positioned on. The method can further include drawing the solder paste to the pins to provide a reworked solder bond bonding at least one of the pins to the plated through hole.

20 Claims, 4 Drawing Sheets

(56)                    References Cited

U.S. PATENT DOCUMENTS

| | | | |
|---|---|---|---|
| 5,309,545 | A | 5/1994 | Spigeralli et al. |
| 5,363,280 | A * | 11/1994 | Chobot ............... H05K 1/0201 |
| | | | 174/266 |
| 5,709,905 | A | 1/1998 | Shaw et al. |
| 5,730,932 | A * | 3/1998 | Sarkhel .................. H05K 3/346 |
| | | | 228/180.1 |
| 6,521,842 | B2 * | 2/2003 | Brinthaupt, III ..... H05K 1/0201 |
| | | | 361/795 |
| 6,651,322 | B1 | 11/2003 | Currie |
| 7,815,096 | B2 | 10/2010 | Hamilton |
| 9,942,993 | B2 * | 4/2018 | Thomson, Jr. ......... H05K 1/115 |
| 2005/0161252 | A1 | 7/2005 | Birgel et al. |
| 2006/0202001 | A1 | 9/2006 | Birchall et al. |

FOREIGN PATENT DOCUMENTS

| | | | |
|---|---|---|---|
| JP | S632831189 | A | 11/1988 |
| JP | 5310081 | B2 | 10/2013 |

OTHER PUBLICATIONS

Freedman, G. M., Patel, K. B., & Batchelder, R. G. (May 1, 2006). Method and process for soldering reflow-compatible plated through-hole components into printed wiring boards in order to circumvent the wave soldering process (buried intrusive reflow soldering and rework. Research Disclosure, 505, 543.
International Search Report from PCT/IB2023/058807 dated Dec. 5, 2023. (14 pages).

* cited by examiner

REWORKING SOLDER COMPONENT WITHOUT PART REMOVAL

BACKGROUND

The present disclosure relates to solder joints between connectors and electrical devices, and more particularly to reworking solder joints.

Reflow soldering with long industrial convection ovens is one method of soldering surface mount technology components or surface mount technology (SMT) to a printed circuit board or PCB. Each segment of the oven has a regulated temperature, according to the specific thermal requirements of each assembly. Reflow ovens meant specifically for the soldering of surface mount components may also be used for through-hole components by filling the holes with solder paste and inserting the component leads through the paste. Wave soldering however, has been the common method of soldering multi-leaded through-hole components onto a circuit board designed for surface-mount components.

When used on boards containing a mix of SMT and plated through-hole (PTH) components, through-hole reflow, when achievable by specifically modified paste stencils, may allow for the wave soldering step to be eliminated from the assembly process, potentially reducing assembly costs. The reflow soldering of through-hole components using solder paste in a convection oven process is called intrusive soldering.

SUMMARY

In one embodiment, a method for forming an electronic device is provide that includes solder bonding pins from a component to plated through holes (PTH) of a board, wherein the component being positioned on a first side of the board. The method further includes applying solder paste to openings of the plated through holes on a second side of the board opposite the first side of the board that the component is positioned on. The method may also include drawing the solder paste to the pins to provide a reworked solder bond bonding at least one of the pins to the plated through hole.

In another embodiment, a method of forming an electrical device is provided that includes solder bonding pins from a component to plated through holes of a board, wherein the component being positioned on a first side of the board; and applying solder paste to openings of the plated through holes on a second side of the board opposite the first side of the board that the component is positioned on. The method may further include melting the solder paste; and drawing the solder paste using gravitational force to the pins to provide a reworked solder bond bonding at least one of the pins to the plated through hole.

In yet another embodiment, a method for forming an electronic device is provided that includes solder bonding pins from a component to plated through holes of a board, the component being positioned on a first side of the board; and applying solder paste to openings of the plated through holes on a second side of the board opposite the first side of the board that the component is positioned on. The method can further include melting the solder paste; and drawing the solder paste with a vacuum to the pins to provide a reworked solder bond bonding at least one of the pins to the plated through hole.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

Figure 1:
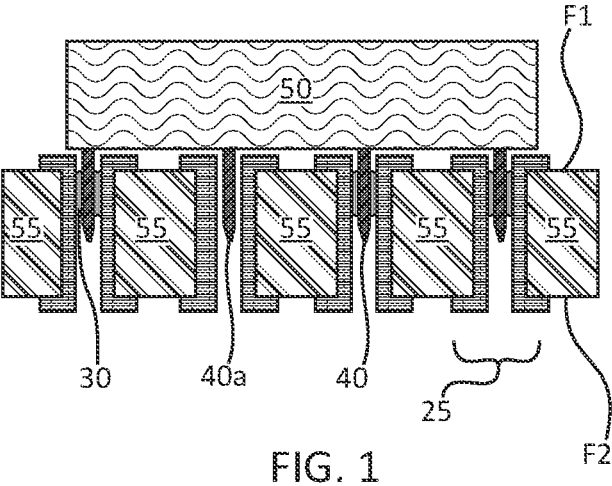
FIG. 1 is a side cross-sectional view illustrating a component that has solder bonded to a board by intrusive solder bonding of pins to plated through-hole (PTH), in which one of the pins is open, or there is insufficient sufficient solder between the pin of the component and the plated through-hole (PTH) to provide a reliable connection, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The methods and structures described herein provide for reworking intrusive solder components without part removal. Intrusive soldering is being applied more and more for a number of positive reasons. For example, intrusive soldering is applicable to solder applications in which the physical thickness of the raw cards is increasing. Additionally, intrusive soldering can provide effective connections to the pin lengths of plated through-hole (PTH) components.

Further, wave soldering methods are legacy type operations that are not cost effective, and the industry in general is looking to move away from this technology for a number of reasons. For example, in some instances, the pins for a solder connection are shorter than the thickness of the card. In some instances, the shortness of component pins when used in cards having greater thickness means that these components can not be adequately and reliably soldered using methods, such as wave soldering or solder pot soldering.

Intrusive soldering provides a solution to some aspects to the aforementioned deficiencies. "Intrusive soldering" is a process in which the solder past for the through-hole component is applied using a stencil or syringe to accommodate through-hole components that are inserted and reflow soldered together with the surface-mount components.

"Reflow soldering", as referred to above in the term "reflow soldered together", is a process in which a solder paste (a sticky mixture of powdered solder and flux) is used to temporarily attach one or thousands of tiny electrical components to their contact pads, after which the entire assembly is subjected to heat, e.g., controlled heat. In response to the application of heat, the solder paste reflows in a molten state, creating permanent solder joints. Heating may be accomplished by passing the assembly through a reflow oven, under an infrared lamp, or (unconventionally) by soldering individual joints with a desoldering hot air pencil.

However, it has been determined that like all solder methods, intrusive soldering also has some deficiencies that can call for reworking. One common situation leading to deficiencies with solder joints formed using intrusive soldering is that because of the smaller dimensions of plated through-hole (PTH) components, the solder volume may be insufficient within the pin hole, which can result in a solder joint having insufficient solder for a reliable contact. In some instances a complete "open" may occur if the operate does not inject past into the holes for the contact. Other deficiencies may result from poor wetting of solder to the pin or plated through-hole (PTH) components.

When these deficiencies occur, one process of record that can correct the above deficiency is a rework process that removes the component from the connection. In one example, the rework process can include the connector/printed circuit board (PCB) being placed in ball grid array (BGA) Hot Gas Rework System, at which the assembly can undergo a global pre-heat, usually to about 120° C. In some examples, the hot gas rework nozzle is positioned and lowered over the Pin In Hole Component. Localized Hot Nitrogen Gas is applied until solder in the plated through-holes (PTH's) melt and then operator with pliers pulls component out. This is how the component is removed from the connection, and this type of prying can disadvantageously damage the component. In some examples, a solder sucker can then be used to remove the solder from the plated through-holes (PTH's). The card can then be allowed to cool, and new solder past can then be applied to the plated through-holes (PTH's). In some examples, a new component can the placed into the plated through holes (PTHs) pushing the paste down the holes. Thereafter, the assembly can then go back on the BGA Hot Gas Rework system. Reflow for providing a new connection may include similar steps pre-heat and localized heating around the component system with a nozzle. The aforementioned process is labor intensive, can damage the components involved and time consuming.

The methods described herein present a rework process that can be done to an intrusive solder component without removing and/or replacing the component being solder to the board/card. More specifically, the methods described herein can perform a rework step using a combination of repacking solder past in combination with gravitational force and/or vacuum techniques to conduct the rework. The methods and structures of the present disclosure are now described in further detail with reference to FIGS. 1-11.

FIG. 1 illustrates one embodiment of a component 50 that has solder bonded (solder illustrated by reference number 30) to a board 55 by intrusive solder bonding of pins 40 to plated through-hole (PTH) 25. In the embodiment depicted in FIG. 1, one of the pins 40a is open, or there is insufficient solder between the pin 40a of the component 50 and the plated through-hole (PTH) 25 to provide a reliable connection.

In one embodiment, the component 50 may be an integrated circuit (IC) chip 5 being solder bonded to the board 55, such as a printed circuit board (PCB). An integrated circuit or monolithic integrated circuit (also referred to as an IC, a chip, or a microchip) is a set of electronic circuits on one small flat piece (or "chip") of semiconductor material. The semiconductor material may be a type IV semiconductor, such as silicon (Si), or may be a type III-V semiconductor material, such as Gallium arsenic (GaAs). Large numbers of field effect transistors (FETs), e.g., MOSFETs (metal-oxide-semiconductor field-effect transistors), can be integrated into the chip. The types of semiconductor devices, e.g., FETs, can include horizontally orientated devices, vertically orientated devices, Fin-type field effect transistors, nanowire and/or nanosheet channel type devices. Any field effect transistor (FET), e.g., a gate structure including a channel separating source and drain region, may be integrated into the chip. The above examples of FET types is provided for illustrative purposes only, and is not intended to be limiting. It is noted that regardless of the device type that is provided by the component, electrically connectivity to the component 50 is through the pins 40, 40*a*. The pins 40, 40*a* are composed of an electrically conductive material, such as a metal, e.g., copper, having dimensions and a geometry for engagement to the plated through holes (PTH) of the board 55.

In some embodiments, the board 55 may be a printed circuit board. The printed circuit board (PCB) includes electrical contact pads and pathways to bring electrical signal to the component 50 that is bonded thereto. The printed circuit board (PCB) may be a metal core printed circuit board (MCPB). In some embodiments, other materials, such as FR4 can also be employed. As noted the pins 40, 40*a* of the component 50 are solder bonded to plated through holes (PTH) 25 of the board 55 to provide for electrical connection between the board 55 and the component 50.

"Plated Through Holes" are features that are either milled or drilled through the body of the board 55, and then plated afterwards with an electrically conductive material. For example, the through holes may be plated with conductive copper (Cu). By running traces between the plated through holes (PTH) 25, components, such as the component identified by reference number 50, soldered in those positions are then electrically connected to other components on the board.

As noted, the solder connection (solder identified by reference number 30) between the pins 40, 40*a* of the component 50 and the plated through holes (PTH) may be provided by intrusive soldering. "Intrusive soldering" is a process in which the solder past for the through-hole component is applied using a stencil or syringe to accommodate through-hole components that are inserted and reflow soldered together with the surface-mount components. The term "solder", as used herein, refers to any metal or metallic compound or alloy that is melted and then allowed to cool in order to join two or more metallic surfaces together. The solder joints 30 may be composed of a metal suitable for soldering. For example, in some embodiments, the solder 30 may be composed of a eutectic alloy of tin and lead or a lead free solder composition. In some examples, the solder 30 may be a Tin/Copper/Nickel based solder, such as Sn-0.7Cu. In another example, the solder 30 may be a Lead/Tin/Silver based solder, such as Pb93-Sn5-Ag2. In yet another example, the solder 30 may be a Tin/Silver based solder, such as Sn-3.5Ag. In an even further example, the solder 30 may be Tin/Silver/Copper based solder, such as Sn-3.8Ag-0.7Cu. In yet an even further example, the solder 30 may be Lead/Tin based solder, such as Pb980-10Sn. Generally speaking, solders have melting temperatures in the range of 150° C. to 300° C.

In the embodiment depicted in FIG. 1, one of the pins 40*a* is open, or there is insufficient sufficient solder between the pin 40*a* of the component 50 and the plated through-hole (PTH) 25 to provide a reliable connection. This condition may be observed visually or electrical testing may be able to determine the existence of the open pin.

Figure 2:
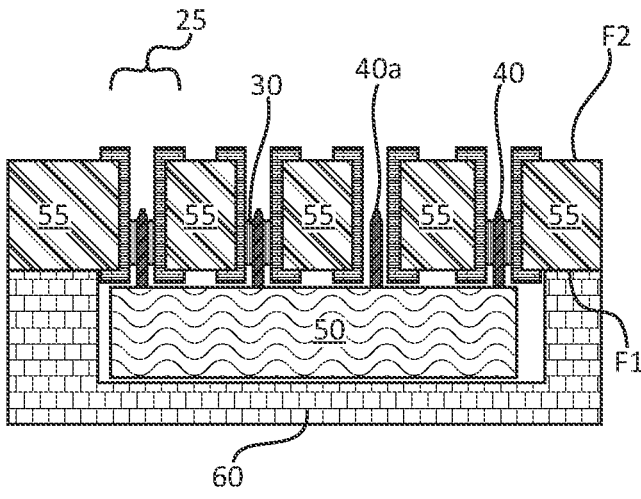
FIG. 2 is a side cross-sectional view illustrating housing the component in a support stiffener so that the end of the plated through holes opposite the side closest to the bonded component are facing upward, in accordance with one embodiment of the present disclosure.

FIG. 2 illustrates one embodiment of housing the component in a support stiffener 60 so that the end of the plated through holes 25 opposite the side closest to the bonded component 50 are facing upward. The side of the plated through holes 25 closes to the bonded component 50 is referred to as being on the front face F1 of the board 55. The side of the plated through holes 25 opposite the front face F1 of the board 55 is referred to as the back face F2 of the board 55. As illustrated in FIGS. 1 and 2, the solder 30 from the initial application via intrusive soldering is positioned closer to the front face F1 of the board 55, as opposed to the back face F2 of the board 55. However, after solder bonding of the component 50 to the plated through holes 25, the openings for pin 40, 40*a* engagement at the front face F1 of the board 55 are obstructed. FIG. 2 illustrates positioning the solder bonded assembly of the component 50 and the board 55 in the support stiffener 60, which mechanically supports the component, and positions the back face F2 of the board 55, so that an additional application of solder may be introduced to the plated through holes 25 from the back face F2 of the board 55.

Figure 3:
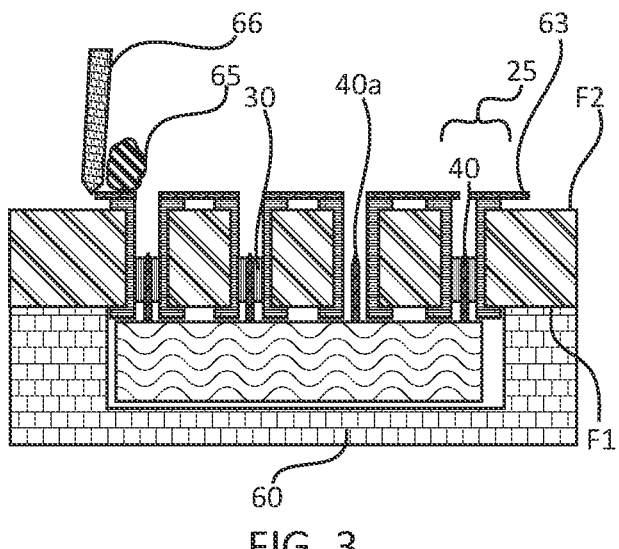
FIG. 3 is a side cross-sectional view illustrating installing a stencil exposing the openings to the plated through holes (PTH), in accordance with one embodiment of the present disclosure.

FIG. 3 depicts one embodiment of installing a stencil 63 exposing the openings to the plated through holes (PTH) 25. Applying the stencil 63 is one step towards applying a solder paste 65 to the pins, e.g., including the open pin 40*a*, from the back face F2 of the board 55 as the component is housed in the support stiffener 60. The stencil 63 may be a structure having holes present therethrough to direct paste being passed through the stencil 63 to at least the open pin 40*a*. In some instances, the stencil 63 may have openings corresponding to all the plated through holes 25 that are being engaged with the pins 40, 40*a* of the component being solder bonded to the board 55. The stencil 63 is composed of a solid material that obstructs the passage of solder paste 65 through the stencil 63, but for the openings that are corresponding to the intended localized application of the solder paste 65. In some examples, the stencil 63 may be a metal plate. In some examples, the stencil 63 may also include an adhesive tape. For example, the stencil may include 63 a silicon adhesive tape with a polyamide base. In some embodiments, the stencil 63 may include a combination of a patterned metal plate having openings corresponding to the plated through holes 25 and adhesive tape. In some embodiments, the stencil 63 may be entirely composed of adhesive tape. In yet further embodiments, instead of employing a stencil 63, a syringe may be employed to apply solder paste 65 to the plated through holes 25.

Figure 4:
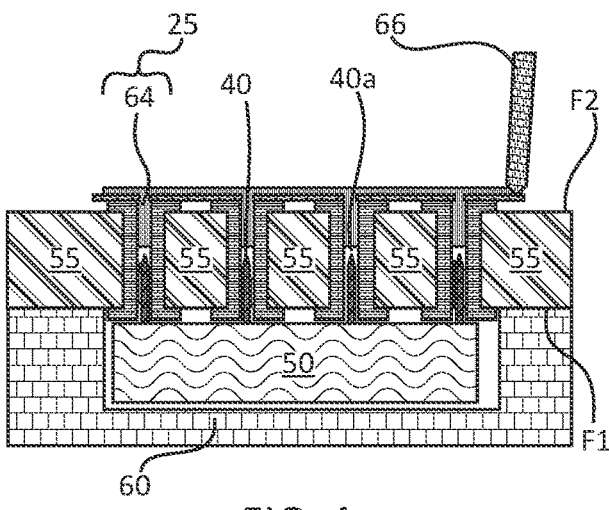
FIG. 4 is a side cross-sectional view illustrating the application of the solder paste to the plated through holes through the stencil, in accordance with one embodiment of the present disclosure.

FIG. 4 illustrates the application of the solder paste 65 to the plated through holes 25 through the stencil 63. The solder paste 65 may first be deposited on the stencil 63, e.g., by brush, syringe, jet, curtain flow, etc., and then the solder paste 65 may be spread and forced through the openings of the stencil 63 using a squeegee 66. A "squeegee" is a tool with a flat, smooth deformable blade, e.g., rubber, plastic and/or metal, that is used to remove or control the flow of materials on substantially flat surfaces, e.g., the stencil 63 (when present).

"Solder paste" is made with a combination of solder powder and a thick flux which is preblended to form a paste. This combination produces a thick material, which allows for easier deposition, typically through stencil printing or deposition. In solder reflow applications, the solder paste is heated to an above liquidus temperature. At this temperature, flux is activated and will remove oxides from the surface of the leads, metal pads, and surface of the solder powder, allowing the solder powder to melt effectively and form solid metal joints.

The alloy type and the particle size of the solder powder in the solder paste 65 determine the time above liquidus, level of oxides, strength of the intermetallic bond, minimum aperture size, and the inner diameter for dispense printing. Flux for the solder past 65 can be made of a combination of components such as rosins, activators, rheological additives, and solvents. The combination of these components determines what subcategory of flux it falls under, which dictates the rheological properties of the material and how the flux removes oxides.

In some embodiments, the alloy component of the solder paste 65 may be composed of a variety of alloys, such as a combination of eutectic (tin and lead) and lead free, typically SAC305 (tin, silver 3.0, copper 0.5). Alloys comprised mostly of tin (Sn) have a low melting point and high tensile and shear strength. Additional metals can also be added to further change the mechanical properties of the alloy. For example, lead can lower the overall melting temperature and forms strong joints with other metals, such as copper and aluminum, which are often used for PCB pads or component leads. Lead-free solder alternatives are attractive, such as SAC305, which is comprised of tin, silver, and copper. Copper reduces the melting point of the alloy and aids in the wetting of the molten solder while silver adds mechanical strength but is less ductile than lead. Additionally, there can be other alloys that have a combination of different metals and percentage levels to improve the quality of the solder joint. Some of these metals include but are not limited to antimony, bismuth, indium, and nickel.

The flux of the solder past is a material in metallurgy that serves multiple functions and is a component in metal joining and extractive metallurgy. Flux provides the functions of being a stabilizer, a flowing agent and/or a chemical cleaning agent. In solder paste, one purpose of flux is to act as a cleaning agent. Flux is a reducing agent that prepares the surface of the metal by removing oxides, debris, and grime. This prepares the surface by preventing oxidation of the metal surface and on the joining material and aids in the wetting of molten metal. The flux of the solder paste 65 may be one of water soluble fluxes, no-clean fluxes, and traditional rosin fluxes.

Following the application of the solder paste 65, the solder paste 65 is forced through the holes in the stencil 63 with the squeegee 66. In the embodiment depicted in FIG. 4, the solder paste 64 is pushed through the openings in the stencil 63 into the openings of the plated through holes 25. At this stage of the process flow, the solder paste 65 is present proximate to the back face F2 of the board 55, and is not in direct contact with the pins 40, 40a.

It is noted that some embodiments have been contemplated in which the solder paste 65 is applied using a syringe directly to the opening of the plated through holes 25. In this example, the stencil 63 and the squeegee 66 may be omitted.

Figure 5:
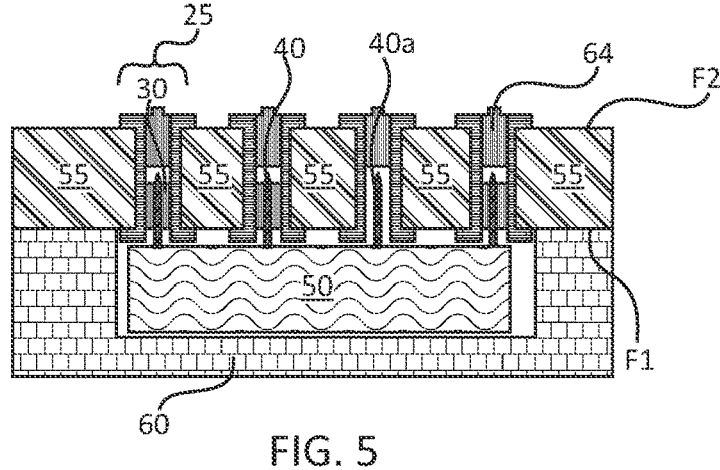
FIG. 5 is a side cross-sectional view illustrating removing the stencil form the structure depicted in FIG. 4.

FIG. 5 illustrates removing the stencil 63 form the structure depicted in FIG. 4. In some embodiments, excess solder may be removed before or during removal of the stencil 63.

Figure 6:
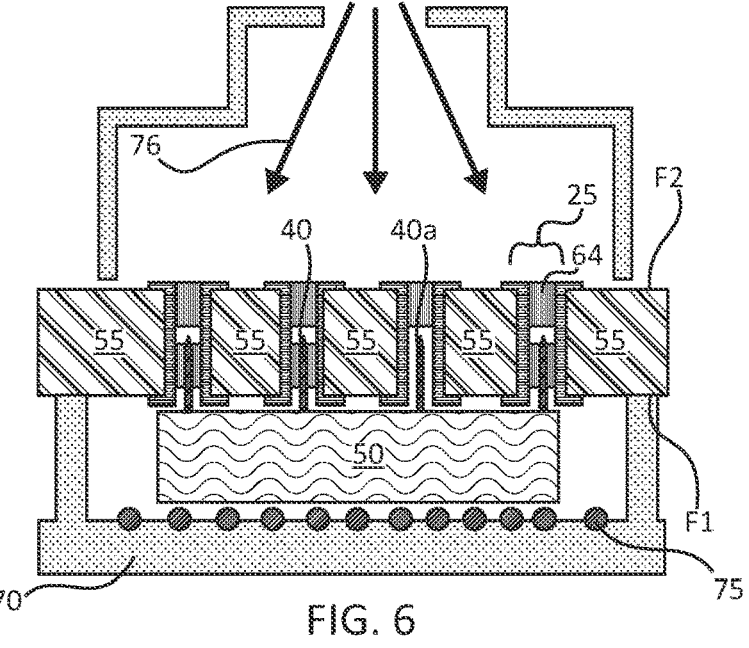
FIG. 6 is a side cross-sectional view illustrates the intrusive solder connected component to the PCB with a second application of solder paste as illustrated in FIG. 5 being positioned within a hot gas ball grid array (BGA) rework station, in accordance with one embodiment of the present disclosure.

FIG. 6 illustrates one embodiment of the intrusive solder connected component 50 to the board 55, e.g., printed circuit board (PCB), with a second application of solder paste 65 being positioned within a hot gas ball grid array (BGA) rework station 70. A BGA rework station 70 is a machine that can be used to refinish, or repair printed circuit boards (PCBs) with ball grid array (BGA) packaging and surface-mounted devices (SMDs). These rework stations allow the technicians to remove defected parts, reinstall incorrectly placed parts or replace any missing part in the PCBs. Generally, the BGA rework station works by forcing a heated gas 76 through a nozzle which is lowered close to the board 55. Additionally, in the embodiment depicted in FIG. 6, the BGA rework station 70 includes backside heating elements 75. The backside heating element 70 can work in combination with the heating gas 76 to increase the temperature of the solder 30, 65.

For the methods of the present disclosure, the assembly of the board 55 and the component 50 having the second application of solder paste 65 to the plated through holes 25 is placed in the Hot Air BGA Rework Machine 70, so that the board 55, e.g., PCB, is upside down in which the intrusive component 55 is down and the exposed openings of the plated through holes (PTH) are facing up. More particularly, the backside face F2 of the board 55 is facing upwards.

Still referring to FIG. 6, to repair the open pin 40a, the hot air nozzle of the Hot Air BGA Rework Machine 70 is aligned to the location of the plated through holes (PTH) 25 that need to be repaired. A hot air rework is then applied. For example, a nitrogen gas may be employed to improve wettability, and the temperature of the hot air rework may be enough to melt the solder, yet not exceed 240° C. In some embodiments, the temperature of the hot air rework may range from 200° C. to 235° C. The time period for the hot air rework is less than 10 minutes, e.g., seven minutes or less.

In some embodiments, aligning the hot air nozzle to the location of the plated through holes that need to be repaired, and conducting the hot air rework recipe causes reflow of the solder paste 65.

Figure 7:
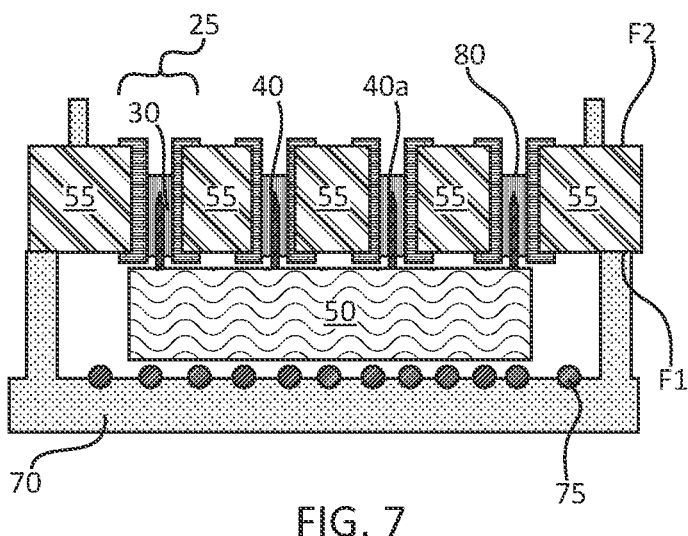
FIG. 7 is a side cross-sectional view of a reflow process applied to the structure depicted in FIG. 6, in which gravity is pulling the solder from the second application illustrated in FIG. 5 deeper into the plated through holes (PTH), in accordance with one embodiment of the present disclosure.

FIG. 7 depicts one embodiment of the reflow process applied to the structure depicted in FIG. 6, in which gravity is pulling the solder of the solder paste 65 from the second application illustrated in FIG. 5 deeper into the plated through holes (PTH) 25. During the reflow, the solder paste 65 melts and gravity pulls the solder down to the pins in the plated through holes 25 into contact with the pins 40, 40a. The solder that flows to the pins forms a reworked solder joint 80 electrically connecting the pins 40, 40a with the plated component of the plated through holes (PTH).

Figure 8:
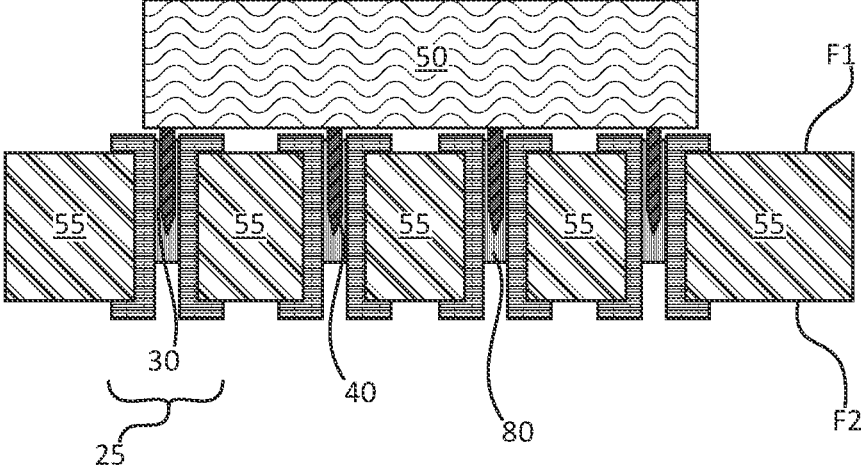
FIG. 8 is a side cross-sectional view illustrating the assembly of the reworked solder joint after cooling and removal from the hot gas ball grid array (BGA) rework station depicted in FIG. 7, in accordance with one embodiment of the present disclosure.

FIG. 8 illustrates the assembly of the reworked solder joint 80 after cooling and removal from the hot gas ball grid array (BGA) rework station 70 depicted in FIG. 7. After reflow, once the assembly is cooled, x-ray location to verify solder open defect, e.g., pin 40a, is repaired. More particularly, in some embodiments, the reworked solder joint 80 provides for direct contact of the solder paste 65 between the plated sidewall of the plated through hole 25 and the pin 40a.

Figure 10:
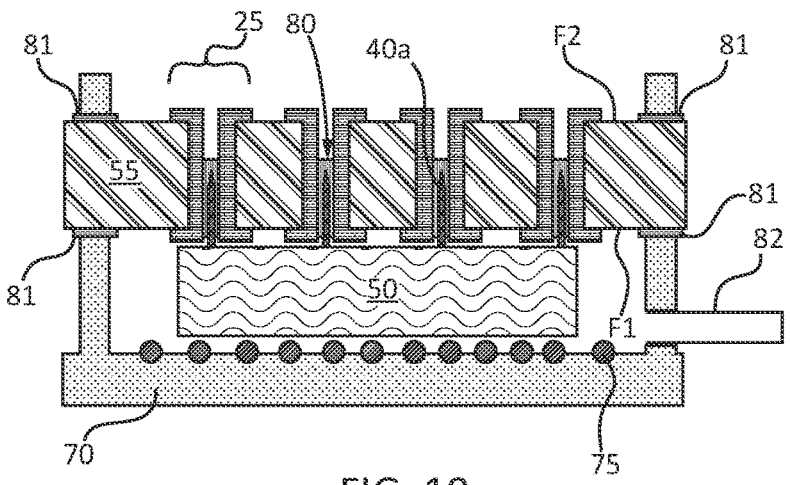
FIG. 10 is a side cross-sectional view of a reflow process applied to the structure depicted in FIG. 9, in which gravitational forces in combination with the application of a vacuum is pulling the solder from the second application illustrated in FIG. 5 deeper into the plated through holes (PTH), in accordance with one embodiment of the present disclosure.
Figure 11:
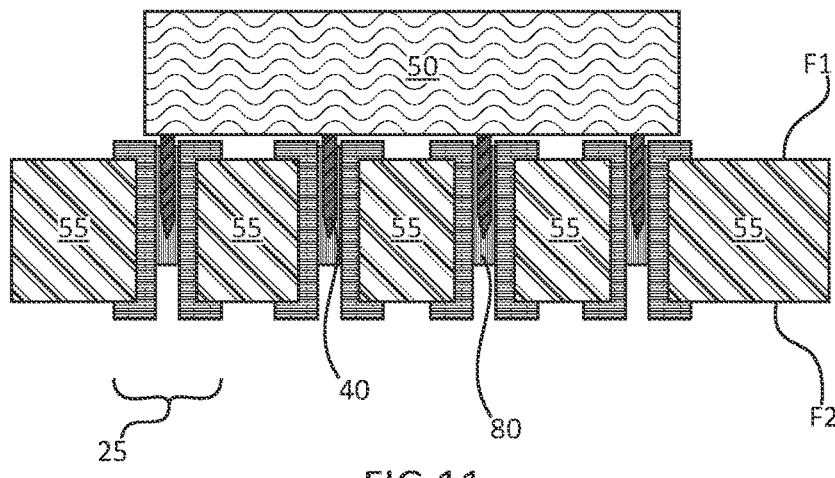
FIG. 11 is a side cross-sectional view illustrating the assembly of the reworked solder joint after cooling and removal from the hot gas ball grid array (BGA) rework station depicted in FIG. 10, in accordance with one embodiment of the present disclosure.

It is noted that the embodiment that is depicted in FIGS. 1-8 only represents one embodiment of the present disclosure. It is further noted that the method that is described with reference to FIGS. 1-8 is not intended to be limited to only the steps illustrated in the supplied figures. For example, any number of preliminary, intermediary and final process steps may also be within the scope of the present claims yet are not depicted in the supplied figures. Further, FIGS. 9-11 illustrate yet another embodiment of the present disclosure, in which a vacuum is also applied to the solder paste 65 during the reflow process to draw the solder into contact with the pins, e.g., open pins 40a.

Figure 9:
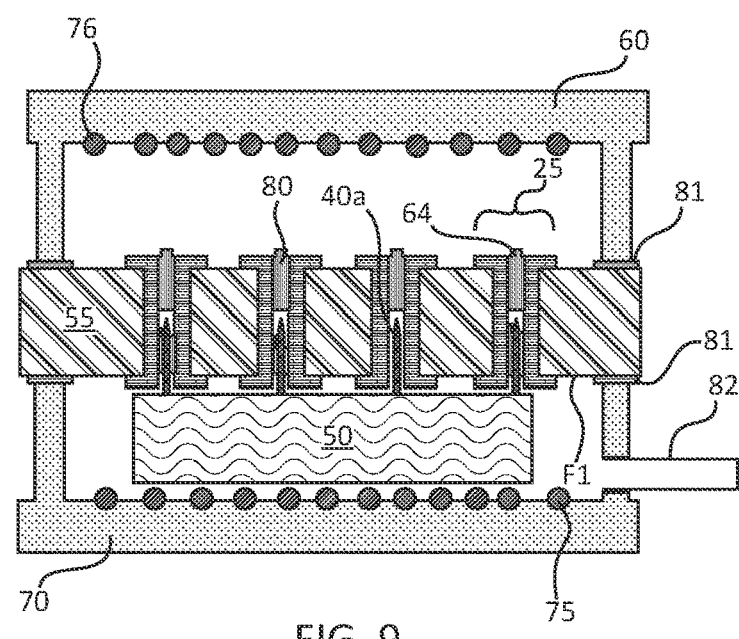
FIG. 9 is a side cross-sectional view of another embodiment of the present disclosure, in which a vacuum is used in combination with gravitational forces to rework the solder following the application in FIG. 5 and the removal of the stencil depicted in FIG. 6, in accordance with another embodiment of the present disclosure.

The embodiment illustrated in FIG. 9 further includes the application of a vacuum for drawing the reflow solder of the solder paste 65 into direct contact with the pins 40, 40a of the component 50 that are present in the plated through holes 25. In some embodiments, the application of the vacuum includes sealing the IR heating element heads 75, 76 to the board 55. Sealing of the IR heating element heads 75, 76 to the board 55, PCB board, may include seals by reference number 81. Following the application of the seals 81, the vacuum can be applied. The assembly of the seals 81, the IR heating element heads 75, 76 and the board 55 define a space, which may function as a vacuum chamber. The vacuum chamber is a rigid enclosure from which air and other gases are removed by a vacuum pump, e.g., applied through the vacuum port 82. This results in a low-pressure environment within the chamber, commonly referred to as a vacuum. For comparison purposes atmospheric pressure is approximately 760 Torr. In some embodiments, the application of the vacuum applied through the vacuum port 82 produces a low vacuum ranging from 760 Torr to 25 Torr. In some embodiments, the application of the vacuum through the vacuum port 82 produces a medium vacuum ranging from 25 to $1 \times 10^{-3}$ Torr. In some embodiments, the application of the vacuum produces a high vacuum (Hard) ranging from $1 \times 10^{-3}$ Torr to $1 \times 10^{-9}$ Torr. In some embodiments, the application of the vacuum produces an Ultra High Vacuum $1 \times 10^{-9}$ to $1 \times 10^{-12}$ Torr. It is noted that the aforementioned vacuum applied through the vacuum port 82 can draw the solder paste 65 from the opening at the back face F2 of the board 50 towards a central portion of the plated through hole 25.

For the methods of the present disclosure, the assembly of the board 55 and the component 50 having the second application of solder paste 65 to the plated through holes 25 is placed in the Hot Air BGA Rework Machine 70, so that the board 55, e.g., PCB, is upside down in which the intrusive component 55 is down and the exposed openings of the plated through holes (PTH) are facing up. More particularly, the backside face F2 of the board 55 is facing upwards.

Still referring to FIG. 9, to repair the open pin 40a, the hot air nozzle of the Hot Air BGA Rework Machine 70 is aligned to the location of the plated through holes (PTH) 25 that need to be repaired. A hot air rework is then applied. In some embodiments, the hot air rework may include aligning the topside IR heating element heat 76 and the bottom side IR heating element head 75 to the location of the plated through holes 25 that need to be repaired, e.g., the plated through hole 25 in which the open pin 40a is present. Similar to the embodiment described with reference to FIG. 1-8, a nitrogen gas may be employed to improve wettability, and the temperature of the hot air rework may be enough to melt the solder, yet not exceed 240° C. In some embodiments, the temperature of the hot air rework may range from 200° C. to 235° C. The time period for the hot air rework is less than 10 minutes, e.g., seven minutes or less.

The embodiment illustrated in FIG. 9 further includes the application of a vacuum for drawing the reflow solder of the solder paste 65 into direct contact with the pins 40, 40a of the component 50 that are present in the plated through holes 25. In some embodiments, the application of the vacuum includes sealing the IR heating element heads 75, 76 to the board 55. Sealing of the IR heating element heads 75, 76 to the board 55, PCB board, may include seals by reference number 81. Following the application of the seals 81, the vacuum can be applied. The assembly of the seals 81, the IR heating element heads 75, 76 and the board 55 define a space, which may function as a vacuum chamber. The vacuum chamber is a rigid enclosure from which air and other gases are removed by a vacuum pump, e.g., applied through the vacuum port 82. This results in a low-pressure environment within the chamber, commonly referred to as a vacuum. For comparison purposes atmospheric pressure is approximately 760 Torr. In some embodiments, the application of the vacuum applied through the vacuum port 82 produces a low vacuum ranging from 760 Torr to 25 Torr. In some embodiments, the application of the vacuum through the vacuum port 82 produces a medium vacuum ranging from 25 to $1 \times 10^{-3}$ Torr. In some embodiments, the application of the vacuum produces a high vacuum (Hard) ranging from $1 \times 10^{-3}$ Torr to $1 \times 10^{-9}$ Torr. In some embodiments, the application of the vacuum produces an Ultra High Vacuum $1 \times 10^{-9}$ to $1 \times 10^{-12}$ Torr. It is noted that the aforementioned vacuum applied through the vacuum port 82 can draw the solder paste 60 from the opening at the back face F2 of the board 50 towards a central portion of the plated through hole 25.

During the reflow, the solder paste 65 melts and the force of gravity and the vacuum pulls the solder down to the pins 40, 40a in the plated through holes of the board 55. FIG. 10 depicts one embodiment of the elevated temperature and vacuum assisted reflow process applied to the structure depicted in FIG. 9, in which a vacuum applied through the vacuum port 82 in addition to gravity is pulling the solder of the solder paste 65 from the second application illustrated in FIG. 5 deeper into the plated through holes (PTH) 25. During the reflow, the solder paste 65 melts and gravity pulls the solder down to the pins 40, 40a in the plated through holes 25 into contact with the pins 40, 40a. The solder that flows to the pins 40, 40a forms a reworked solder joint 80 electrically connecting the pins 40, 40a with the plated component of the plated through holes (PTH).

FIG. 11 illustrates the assembly of the reworked solder joint 80 after cooling and removal from the hot gas ball grid array (BGA) rework station 70 depicted in FIG. 7. After reflow, once the assembly is cooled, x-ray location to verify solder open defect, e.g., pin 40a, is repaired. More particularly, in some embodiments, the reworked solder joint 80 provides for direct contact of the solder paste 65 between the plated sidewall of the plated through hole 25 and the pin 40a.

As illustrated, the reworking of the solder joint depicted in FIGS. 1-11 allow for the component 50 to remain engaged to the board 55, e.g., printed circuit board (PCB). More specifically, a solder joint 80 may be made to correct the open pin 40a that resulted following engagement of the component 50 to the board 55 by intrusive solder. The solder joint 80 results from a second application of solder paste 65 to a backside of the plated through hole 25, wherein engagement of the solder paste 65 to the pins 40, 40a may be aided by elevated temperatures, gravitational forces and/or a vacuum.

It is to be understood that aspects of the present invention have been described in terms of a given illustrative architecture; however, other architectures, structures, substrate materials and process features and steps can be varied within the scope of aspects of the present invention.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, e singular forms "a" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower" "above" "upper," and the like, can be used herein for ease of description to describe one element's or feature's relationship to another element(s) or feature(s) as illustrated in the FIGS. It rill be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

While the methods and structures for reworking solder components without part removal have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

The invention claimed is:

1. A method for forming an electronic device comprising:
   bonding pins from a component to plated through holes of a board, the component being positioned on a first side of the board;
   applying solder paste to openings of the plated through holes on a second side of the board opposite the first side of the board that the component is positioned on; and
   drawing the solder paste to the pins to provide a reworked solder bond bonding at least one of the pins to the plated through holes.

2. The method of claim 1, wherein the solder bonding of the pins from the component to the plated through holes of the board are bonded using intrusive solder bonding.

3. The method of claim 1, wherein an open pin that is not solder bonded to the plated through holes of the board results from the solder bonding of the pins from the component to the plated through holes of the board.

4. The method of claim 3, wherein the open pin is solder bonded by the drawing of the solder paste to the pins to provide the reworked solder bond.

5. The method of claim 4, wherein the drawings of the solder paste comprises reflow of the solder paste by heating the solder paste and gravitational force to pull the solder paste to the pins.

6. The method of claim 1, wherein the drawing of the solder paste comprises applying a vacuum.

7. The method of claim 1, wherein applying the solder paste comprises:
   applying a stencil to the second side of the board, the stencil having openings corresponding to the plated through boles; and
   forcing the solder paste through the openings of the stencil.

8. The method of claim 7, wherein the stencil comprises at least one of a metal plate, an adhesive tape or a combination thereof.

9. A method for forming an electronic device comprising:
   bonding pins from a component to plated through holes of a board, the component being positioned on a first side of the board;
   applying solder paste to openings of the plated through holes on a second side of the board opposite the first side of the board that the component is positioned on;
   melting the solder paste; and
   drawing the solder paste using gravitational force to the pins to provide a reworked solder bond bonding at least one of the pins to the plated through holes.

10. The method of claim 9, wherein the solder bonding of the pins from the component to the plated through holes of the board are bonded using intrusive solder bonding.

11. The method of claim 9, wherein an open pin that is not solder bonded to the plated through holes of the board results from the solder bonding of the pins from the component to the plated through holes of the board.

12. The method of claim 11, wherein the open pin is solder bonded by the drawing of the solder paste to the pins to provide the reworked solder bond.

13. The method of claim 9, wherein applying the solder paste comprises:

applying a stencil to the second side of the board, the stencil having openings corresponding to the plated through holes; and forcing the solder paste through the openings of the stencil.

14. The method of claim 13, wherein the stencil comprises at least one of a metal plate, an adhesive tape or a combination thereof.

15. A method for forming an electronic device comprising:

bonding pins from a component to plated through holes of a board, the component being positioned on a first side of the board;

applying solder paste to openings of the plated through holes on a second side of the board opposite the first side of the board that the component is positioned on;

melting the solder paste; and drawing the solder paste with a vacuum to the pins to provide a reworked solder bond bonding at least one of the pins to the plated through holes.

16. The method of claim 15, wherein the solder bonding of the pins from the component to the plated through holes of the board are bonded using intrusive solder bonding.

17. The method of claim 15, wherein an open pin that is not solder bonded to the plated through holes of the board results from the solder bonding of the pins from the component to the plated through holes of the board.

18. The method of claim 15, wherein the open pin is solder bonded by the drawing of the solder paste to the pins to provide the reworked solder bond.

19. The method of claim 18, wherein applying the solder paste comprises:

applying a stencil to the second side of the board, the stencil having openings corresponding to the plated through holes; and forcing the solder paste through the openings of the stencil.

20. The method of claim 19, wherein the stencil comprises at least one of a metal plate, an adhesive tape or a combination thereof.

* * * * *